US012698937B2

(12) United States Patent　　　　　　(10) Patent No.:　US 12,698,937 B2

Molteni et al.　　　　　　　　　　　　(45) Date of Patent:　　　Aug. 4, 2026

(54) CONVERTER DEVICE AND ELECTRIC POWER SUPPLY APPARATUS

(71) Applicant: DANIELI AUTOMATION S.P.A., Buttrio (IT)

(72) Inventors: Roberto Molteni, Tradate (IT); Antonello Mordeglia, Bangkok (TH)

(73) Assignee: DANIELI AUTOMATION S.P.A., Buttrio (IT)

( * ) Notice: Subject to any disclaimer, the term of this patent is extended or adjusted under 35 U.S.C. 154(b) by 1077 days.

(21) Appl. No.: 17/773,026

(22) PCT Filed: Oct. 28, 2020

(86) PCT No.: PCT/IT2020/050260

§ 371 (c)(1),
(2) Date: Jan. 20, 2023

(87) PCT Pub. No.: WO2021/084566

PCT Pub. Date: May 6, 2021

(65) Prior Publication Data

US 2022/0412651 A1　　　Dec. 29, 2022

(30) Foreign Application Priority Data

Oct. 28, 2019　　(IT) ......................... 102019000019868

(51) Int. Cl.
*F27B 3/28*　　　　　(2006.01)
*F27B 3/08*　　　　　(2006.01)
(Continued)

(52) U.S. Cl.
CPC ................ *F27B 3/28* (2013.01); *F27B 3/085* (2013.01); *H02J 3/38* (2013.01); *H02M 1/0067* (2021.05);
(Continued)

(58) Field of Classification Search
CPC ... F27B 3/085; F27B 3/28; H02J 3/38; H02M 1/0067; H02M 1/126; H02M 7/003;
(Continued)

(56) References Cited

U.S. PATENT DOCUMENTS 6,274,851 B1　　8/2001　Mulcahy et al.
8,488,319 B2 *　7/2013　Santos .................. H02M 7/003
363/141
(Continued)

FOREIGN PATENT DOCUMENTS

CN　　　205 377 680 U　　7/2016
CN　　　206850429 U　　　1/2018
(Continued)

OTHER PUBLICATIONS

International Search Report and Written Opinion for PCT/IT2020/050260, mailed Jan. 22, 2021.

*Primary Examiner* — Quang T Van

(74) *Attorney, Agent, or Firm* — MARSHALL, GERSTEIN & BORUN LLP

(57)　　　　　　　ABSTRACT

A converter device configured to convert direct voltage and current into alternating voltage and current to be supplied to a load. The converter device includes a bank of capacitors, a plurality of power semiconductors, a heat sink and a casing.

14 Claims, 2 Drawing Sheets

(51) Int. Cl.

| | |
|---|---|
| *H02J 3/38* | (2006.01) |
| *H02M 1/00* | (2006.01) |
| *H02M 1/12* | (2006.01) |
| *H02M 7/00* | (2006.01) |
| *H02M 7/537* | (2006.01) |
| *H05B 7/20* | (2006.01) |
| *H05K 7/20* | (2006.01) |

(52) U.S. Cl.
CPC ........... *H02M 1/126* (2013.01); *H02M 7/003* (2013.01); *H02M 7/537* (2013.01); *H05B 7/20* (2013.01); *H05K 7/209* (2013.01)

(58) Field of Classification Search
CPC ........ H02M 7/48; H02M 7/537; H05B 7/148; H05B 7/20; H05K 7/209; Y02P 10/25
USPC ........ 219/660, 661, 663, 715, 717; 373/104, 373/102, 147, 148; 361/600, 601, 602, 361/627, 628, 634, 651
See application file for complete search history.

(56) References Cited

U.S. PATENT DOCUMENTS

| | | | |
|---|---|---|---|
| 2014/0268570 | A1 | 9/2014 | Crouch et al. |
| 2016/0094179 | A1 | 3/2016 | Yamamoto |

FOREIGN PATENT DOCUMENTS

| | | | |
|---|---|---|---|
| CN | 109193655 | A | 1/2019 |
| DE | 10 2017 206774 | A1 | 10/2018 |
| JP | H02289362 | A | 11/1990 |
| JP | 2016-123235 | A | 7/2016 |

\* cited by examiner (fig. 1a)

CONVERTER DEVICE AND ELECTRIC POWER SUPPLY APPARATUS

FIELD OF THE INVENTION

Embodiments described here concern a converter device, or inverter, suitable to transform a direct electrical quantity into an alternating electrical quantity. In particular, the invention concerns a high power converter device, of the type that can be used advantageously but not exclusively for medium voltage applications.

Embodiments described here also concern an electric power supply apparatus, which uses one or more of said converters or inverters, and suitable to power a load that requires high power, such as, by way of example, an electric arc furnace.

BACKGROUND OF THE INVENTION

It is known to use converter devices, to convert a direct electrical quantity into an alternating electrical quantity, used to power a determinate load, which can be more or less constant, or variable.

Depending on the needs and different applications, converter devices can be used individually, or connected to each other.

From patent EP-B-3124903, in the name of the present Applicant, an electric power supply apparatus for an electric arc furnace is known, which comprises a device for positioning the electrodes, and a regulation unit comprising a plurality of converters which are selectively controllable to regulate the supply voltage and current of the electrodes.

The power supply apparatus described in EP'903 therefore behaves as an adjustable current generator, and is able to generate the electric power required to power an electric arc furnace according to the step of the process in which it is operating (perforation, melting, refining). This distinguishes the solution of EP'903 from traditional solutions in which the transformer behaves as a voltage generator and the current is not controllable, but is limited only by the parameters of the equivalent circuit, which vary according to the step of the process.

The power supply apparatus described in EP'903 also allows to regulate the current and voltage of the arc separately, in such a way as to considerably limit the current variations in the first step of the process, that is, in the perforation step, and make it practically stable in the subsequent melting and refining steps.

One of the most obvious advantages that are obtained is the stability of the regulation of the electrodes, as opposed to conventional plants in which the electrodes are in continuous movement due to the instability of the current supplied, having to ensure the persistence of the arc with uncontrolled current.

The limit of the power supply apparatus described in EP'903 is given by the maximum current that the current control can provide.

The power is then modified by regulating, according to the current supplied, the voltage of the arc, which in turn can be modified both mechanically, by raising and lowering the electrode with the positioning device, and also by piloting the PWM (Pulse-Width Modulation) to control the converter devices.

Standard high power converters or inverters for medium voltage applications generally comprise a bank of capacitors, connected in series and/or in parallel with each other, suitable for storing energy in direct current, a heat sink, and a plurality of power semiconductors connected to the bank of capacitors and mounted on the heat sink. The components of the converter are normally enclosed in a metal casing, which is provided with input and output connectors which can be connected respectively to an upstream circuit, for example an electric power supply grid, and to a downstream circuit, for example connected to a load or user device to be powered.

For example, converters are known which comprise power semiconductors, for example IGBT modules (Insulated-Gate Bipolar Transistor), which are alternately opened and closed according to the passage of a positive or negative current half-wave.

The bank of capacitors and the heat sink are normally earthed, and the earth connection is integral with the casing of the converter, which is also generally earthed for safety reasons.

Each IGBT module is piloted by a board that switches the static semiconductor switches on and off, and they allow the current to flow toward the load. With a defined profile of on and off pulses, the semiconductor switches power the load with rectangular pulses of varying amplitude.

By suitably applying a PWM modulation (Pulse-Width Modulation) to an Ohmic-inductive type circuit, a sinusoidal type envelope is obtained. This digital modulation, in fact, allows to obtain a variable average voltage depending on the ratio between the duration of the positive pulse (ON) and the overall duration of the pulse (ON+OFF); this ratio is defined as duty cycle.

The IGBT modules consist of suitably doped silicon chips, disposed on a thermally conductive but electrically insulating substrate, which in turn is welded to a tinned copper base. The chips are then encapsulated in a plastic case, inside which they are protected with filler gel, connected with a wire-bonding system to the external terminals, to which the cables or power bars and the signal bars are connected, which control the switching on and off of the IGBT.

To dissipate the heat generated during functioning, the IGBTs are attached on the heat sink, suitably sized, which can be cooled by forced ventilation or water.

The base of the IGBT and the heat sink constitute two flat surfaces facing each other with a dielectric placed between them, in particular a thermal paste that serves to improve the heat transfer between the two surfaces, so that a parasitic capacitance is formed for each power semiconductor present in the module.

The construction of the converter or inverter, as described above, entails the generation of parasitic capacitances, which are formed in particular between the power semiconductors and the heat sink which is connected to the casing of the converter, and between the containing body of the capacitors and the casing of the converter.

When the switches switch on and off to allow the generation of the sinusoidal wave toward the load, that is, the positive and negative half waves formed by the passage of the current in the converter, in the case of application in a power supply apparatus of an electric arc furnace, they switch the voltage, for example from 1800V to 0V, and vice versa, with switching times in the order of hundreds of nanoseconds. A very big variation is therefore obtained in the voltage with respect to time dv/dt, in the order of 5 kV/microsecond, so that the parasitic capacitances entail the generation of a current to earth.

The intensity of the current directed to earth, in fact, can be calculated with the formula:

3

$$i = C * \frac{\Delta V}{\Delta T}$$

where $\Delta V$ is the variation in voltage (given by the difference between 1800V and 0V, or vice versa);

$\Delta T$ is the time in which the variation occurs, equal to about 250 nanoseconds; C is the parasitic capacitance generated between the base of the IGBT modules and the heat sink.

For example, if the parasitic capacitance for an IGBT module is about 2 nF, the overall parasitic capacitance, for example, for four IGBT modules is about 8 nF, which is added to the overall capacitance of the capacitors, so that a capacitance for each single converter device of about 25-30 nF can be obtained In the case of a power supply system provided with a plurality of converter devices, for example 60 modules, a very high overall capacitance of about 1.5-1.8 μF can be obtained. Each time the switches of the IGBT modules switch to define the sinusoidal wave, therefore, due to the total capacitance, a current to earth is generated, having a peak that can also considerably exceed 200-250 A.

Furthermore, since each internal connection to each converter device, defined by a conductor with a determinate length, has parasitic inductances, damped oscillations are generated in the development of the current generated by the parasitic capacitances.

In power supply systems of the type described above, the peak and oscillations of the parasitic current that is generated can lead to the accidental intervention of various protections, desaturation, or the fault of the programmed opening/closing state of the module drivers, with consequent risk of breakdowns, error of auxiliary power supplies, overvoltage, undervoltage, AC error, etc. Some of these interventions are not due to a real alarm, but are simply signal disturbances that are interpreted by the control systems as alarms.

In some cases, however, the disturbance is such as to truly generate a malfunction, or "fault", for example in the auxiliary power supplies.

US2014/268570 A1 discloses an inverter which includes a housing assembly, a capacitor assembly, a number of arm assemblies, a number of heat sinks, and a support assembly. The housing assembly includes a number of sidewalls defining an enclosed space. The capacitor assembly is coupled to the housing assembly. Each arm assembly includes a plurality of electrical components and a number of electrical buses. Each arm assembly is coupled to, and in electrical communication with, the capacitor assembly. The support assembly includes a non-conductive frame assembly. The support assembly is structured to support each the heat sink in isolation. A sealing compound is applied to each electrical bus and to a limited number of the electrical components. Thus, a limited number of electrical components are substantially sealed from an atmosphere, and the components that are not encased in the sealing compound may be repaired or replaced on site.

DE102017206774A1 discloses an electrical control device comprising a number of components to be cooled and a heat sink arranged within a housing, the heat sink being electrically insulated from a reference potential, and the components to be cooled are coupled to the heat sink in a thermally conductive manner.

JP2016123235A discloses a power conversion circuit to reduce influences of electromagnetic noise to be exerted upon a control circuit by a DC power source and to prevent an inverter device from being large-scaled in the case where a DC power supply connector, the control circuit of a power conversion circuit and the power conversion circuit are arranged in order in a direction orthogonal with an arrangement surface on which the power conversion circuit is arranged.

U.S. Pat. No. 6,274,851 discloses a controller for an electric arc furnace provided with a damper comprising low pass filters, each coupled to an output phase, in which the resistive and capacitive components are fixed and not modifiable.

There is therefore a need to perfect a converter device which can overcome at least one of the disadvantages of the state of the art.

In particular, one purpose of the present invention is to provide a converter device which allows to limit, if not eliminate, the parasitic capacitances, and therefore the parasitic current that they generate to earth.

Another purpose of the present invention is to provide a converter device which is effective and reliable and can be used both individually and also in combination with other converter devices, limiting the generation of possible parasitic currents.

Another purpose of the present invention is to perfect an apparatus to power a load, applicable for example for powering an electric arc furnace, which is simple to manufacture and allows to prevent the generation of unwanted currents to earth, which could disturb and make the alarm and control signals inefficient, or at least reduce their entity, making them negligible.

The Applicant has devised, tested and embodied the present invention to overcome the shortcomings of the state of the art and to obtain these and other purposes and advantages.

SUMMARY OF THE INVENTION

The present invention is set forth and characterized in the independent claims. The dependent claims describe other characteristics of the present invention or variants to the main inventive idea.

In accordance with the above purposes, a converter device, or inverter, is provided suitable to convert direct voltage and current into voltage and alternating supply current, to be supplied to a load, usable for medium voltage applications that require high power.

The converter device according to the invention can be used, in combination with a plurality of converter devices substantially of the same type, in power supply apparatuses to supply a voltage and a current suitable to power a load that requires high power, such as, by way of example only, the electrodes of an electric arc furnace.

According to some embodiments, the converter device comprises a bank of capacitors, connected, during use, to a power supply circuit, and suitable to accumulate electrical energy in direct current, and a plurality of power semiconductors connected to the bank of capacitors and configured to be selectively turned on and off in order to allow the generation of a sinusoidal current wave toward an output. The converter device also comprises a heat sink on which the power semiconductors are installed, and which is configured to dissipate the heat generated by them during functioning.

The converter device also comprises a casing, that is, a metal shell, which encloses inside it the bank of capacitors, the heat sink and the unit of power semiconductors.

The casing is provided with input and output connectors connectable, during use, to a power supply circuit or grid, and to a load to be powered.

According to some embodiments, the casing of the converter device can be connected to earth for safety reasons.

According to one aspect of the present invention, at least one of either the heat sink and/or the bank of capacitors has floating electric potential with respect to the casing of the converter device, that is, it is not at the same reference potential as the casing of the converter device.

According to some embodiments, both the heat sink and also the bank of capacitors are floating with respect to the casing.

According to some embodiments, the heat sink and/or the bank of capacitors are/is electrically isolated with respect to the casing and therefore to the earth connection connected to it, substantially preventing the passage of direct currents between the two components.

According to further embodiments, the heat sink and/or the bank of capacitors are/is connected to the casing by means of high-impedance components or circuits, thus considerably limiting the generation of a parasitic current to earth.

According to some embodiments, the converter device comprises at least a first high-impedance component connected between the heat sink and the earth of the casing of the converter device.

In this way, the heat sink is substantially isolated with respect to the casing of the converter device, and therefore to earth, considerably limiting the generation of a parasitic current to earth, at least in relation to the peak value.

According to some embodiments, the converter device comprises a plurality of second high-impedance components, each connected between the containing body of a capacitor and the earth connection of the casing of the converter device.

In this way, since the capacitors are advantageously substantially isolated and separated from the casing of the converter device, the possible parasitic currents that are generated to earth have a negligible peak value.

By providing that both the heat sink and also the capacitors are isolated with respect to the casing of the converter device, thanks to the presence of the first and second high-impedance components, it is possible to substantially eliminate the parasitic capacitances generated by them, and therefore considerably reduce the current peak to earth.

This advantage is particularly evident if using a plurality of converter devices connected to each other.

According to further embodiments, the converter device comprises at least one low-pass electrical filter, connected between an output connector suitable to be connected to the load to be powered, and the earth connection, and configured to eliminate possible oscillations of the current to earth, due to distributed parasitic inductances and capacitances, having frequencies higher than the working frequency.

According to some embodiments, the low-pass electrical filter is an RC electrical filter comprising a resistive component and a capacitive component located in series with each other, and connected between the output connection and the earth connection.

According to some embodiments, the resistive component and the capacitive component can be sized as a function of the application of the converter device and the characteristics of the load to be powered. These components can possibly also be modified in order to adapt to changes in the overall electrical system.

According to some embodiments, the resistive component and the capacitive component can be regulated to change the respective resistance and capacitance values so as to increase or reduce the intensity of current that flows through them.

According to some embodiments, the RC electrical filter can comprise dissipation means configured to reduce the temperature of the resistive and/or capacitive components.

According to some embodiments, the RC electrical filter can also comprise temperature measurement means, for example associated with one or more of the resistive or capacitive components.

Some embodiments described here also concern an apparatus to supply electric power to a high-power load, in particular of the ohmic-inductive type.

The electric power supply apparatus comprises:

a transformer connected to a power grid that supplies an alternating mains voltage and an alternating mains current, the transformer being configured to transform the alternating mains voltage and the alternating mains current into an alternating base voltage and an alternating base current;

a plurality of rectifiers connected to the transformer and configured to transform the alternating base voltage and alternating base current into direct voltage and electric current, a plurality of converter devices as previously described, connected on one side to the rectifiers and on the other to the load, and configured to convert direct voltage and current into a voltage and an alternating supply current, to be supplied to the load;

a control and command unit configured to control and command the functioning of the converter devices and regulate the voltage and the supply current over time.

According to some embodiments, the apparatus to power a load according to the invention comprises a low-pass electrical filter connected downstream of the converter devices and configured to attenuate, or possibly eliminate, current oscillations directed to earth.

According to some embodiments, the low-pass electrical filter comprises an RC electrical filter connected between an output of the converter devices and the earth connection.

According to some embodiments, the presence of the RC filter connected to earth allows to also attenuate possible oscillations due to parasitic capacitances generated by other components of the power supply apparatus that can be connected to earth, such as transformers, cables, pipes, etc.

According to some embodiments, there is a single RC electrical filter of the three-phase type, connected on the three output phases of the power supply apparatus.

According to some embodiments, in the event that the power supply apparatus is used to power an electric arc furnace, the RC electrical filter is connected on the three phases that are connected to the electrodes of the furnace.

ILLUSTRATION OF THE DRAWINGS

These and other aspects, characteristics and advantages of the present invention will become apparent from the following description of some embodiments, given as a non-restrictive example with reference to the attached drawings wherein:

FIG. 1a is a schematic view of a component of the converter device of FIG. 1 according to a first embodiment;

Figure 1:
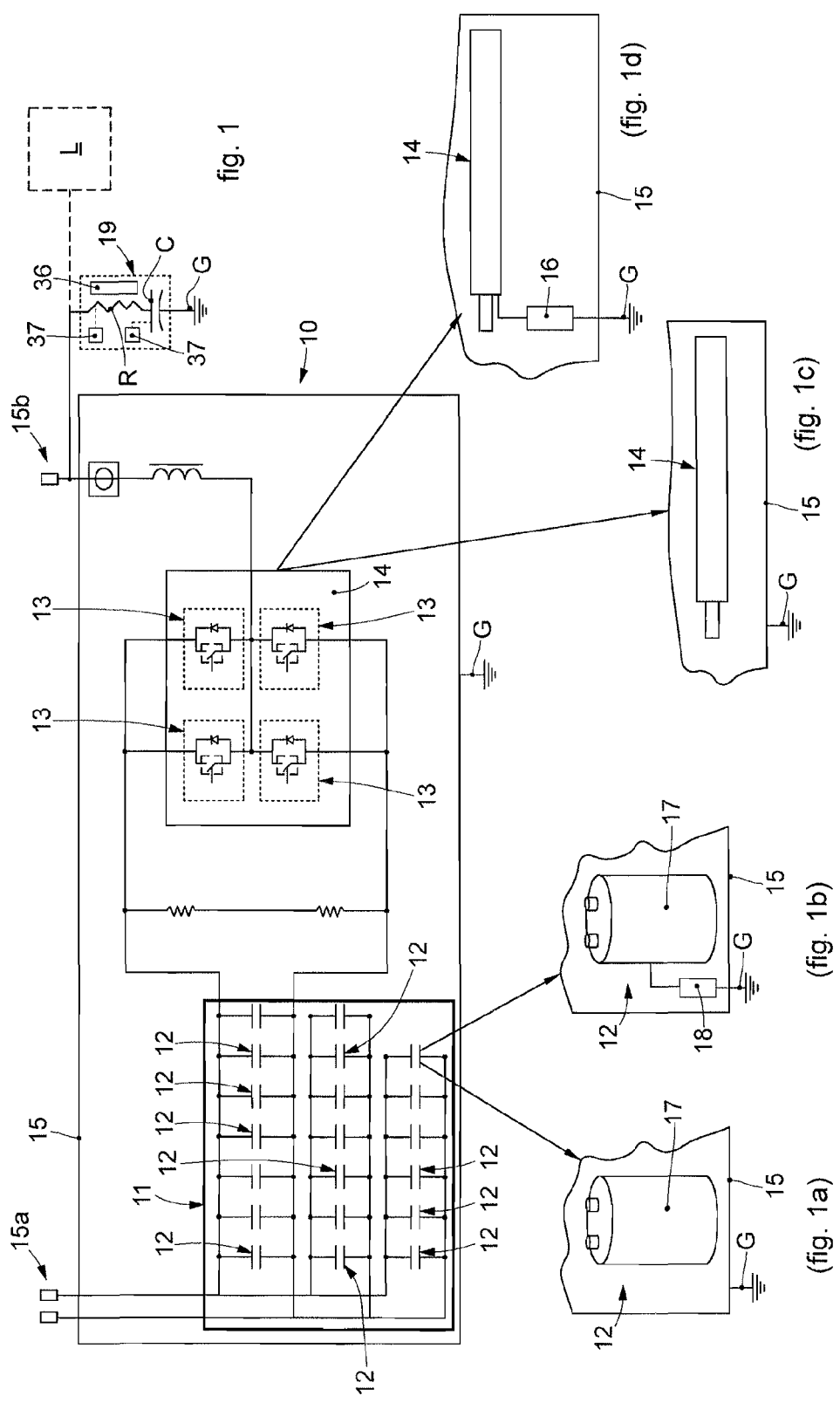
FIG. 1 is a schematic view of a converter device according to some embodiments described here.
Figure 2:
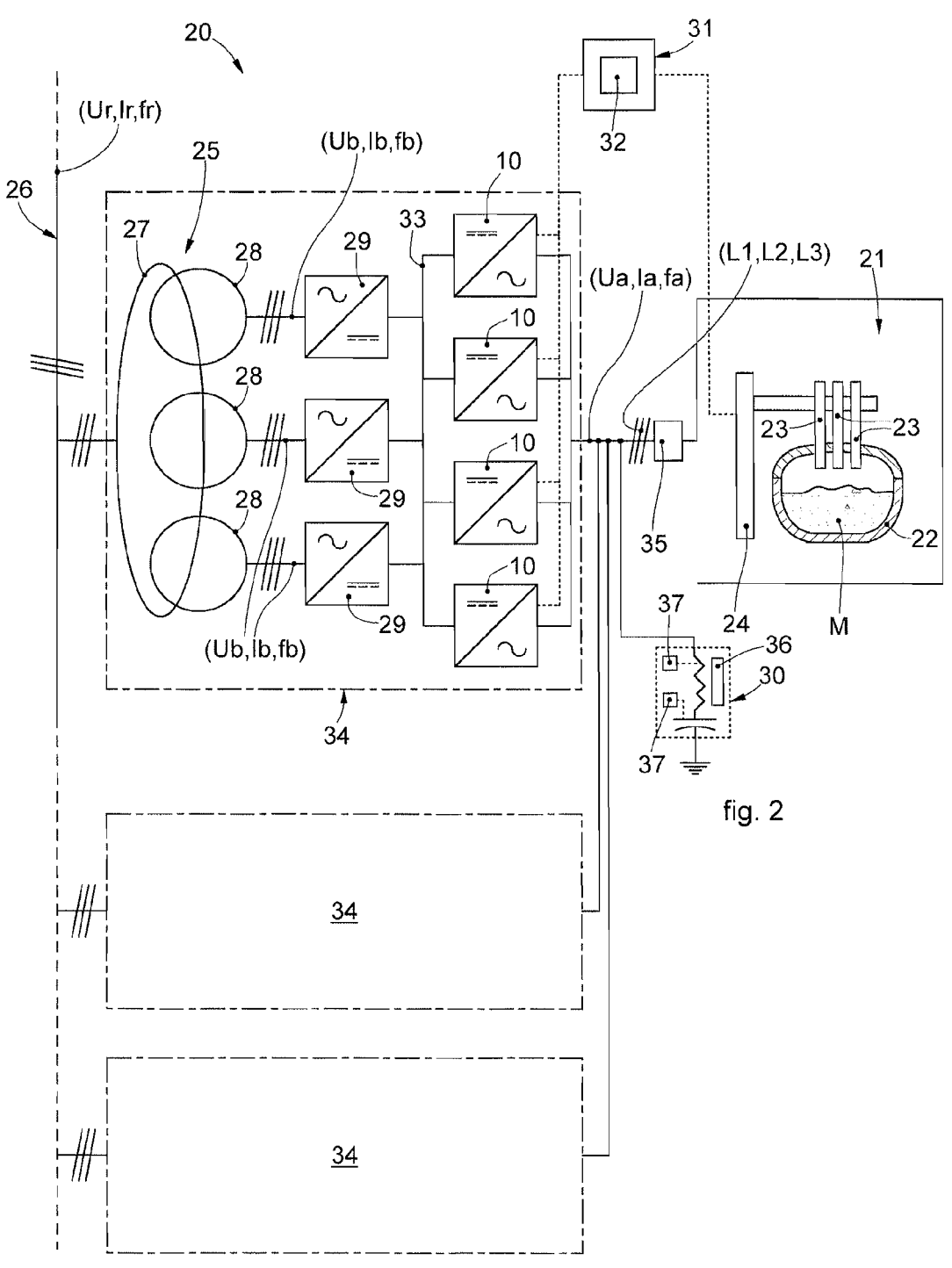

FIG. 1*b* is a schematic view of a component of the converter device of FIG. 1 according to a variant embodiment;

FIG. 1*c* is a schematic view of another component of the converter device of FIG. 1 according to a first embodiment;

FIG. 1*d* is a schematic view of another component of the converter device of FIG. 1 according to a variant embodiment;

FIG. 2 is a schematic view of an apparatus to supply electric power to a high-power load applied to an electric arc furnace.

To facilitate comprehension, the same reference numbers have been used, where possible, to identify identical common elements in the drawings. It is understood that elements and characteristics of one embodiment can conveniently be incorporated into other embodiments without further clarifications.

DESCRIPTION OF EMBODIMENTS

We will now refer in detail to the possible embodiments of the invention, of which one or more examples are shown in the attached drawings. Each example is supplied by way of illustration of the invention and shall not be understood as a limitation thereof. For example, one or more characteristics shown or described insomuch as they are part of one embodiment can be varied or adopted on, or in association with, other embodiments to produce another embodiment. It is understood that the present invention shall include all such modifications and variants.

Some embodiments described here with reference to FIG. 1 concern a converter device, indicated with reference number 10, suitable to convert direct voltage and current into alternating voltage and current.

The converter device 10 can be used, for example, for medium voltage applications that require high power.

The converter devices 10 according to the invention can advantageously be used both individually and also in combination with a plurality of other converter devices 10.

Some embodiments described here also concern an electric power supply apparatus, indicated as a whole with reference number 20 (FIG. 2), configured to supply a current and a voltage in alternating current suitable to power a load 21 that requires high power, in particular of the ohmic-inductive type.

FIG. 2 shows, by way of example, the application of the power supply apparatus 20 to a load corresponding to an electric arc furnace 21, but this power supply apparatus 20 can also be used to power loads of different types, for example a ladle furnace, or a submerged arc furnace.

According to some embodiments, the converter device 10 comprises a capacitor bank 11 which includes a plurality of capacitors 12 connected together in series and/or parallel, configured to accumulate electrical energy in direct current.

The converter device 10 also comprises a plurality of power semiconductors 13 connected to the capacitor bank 11 and configured to be selectively turned on and off to allow the generation of a sinusoidal current wave toward an output.

The converter device 10 also comprises a dissipator device 14, on which the power semiconductors 13 are attached and installed, which is configured to dissipate the heat generated by the latter during functioning.

According to some embodiments, the heat sink 14 is of the water cooled type, although it is not excluded that for certain applications a heat sink 14 cooled with forced air may be used.

In accordance with one possible solution, the power semiconductors 13 comprise devices chosen from a group comprising SCR (Silicon Controlled Rectifier), GTO (Gate Turn-Off thyristor), IGCT (Integrated Gate-Commutated Thyristor), MCT (Metal-Oxide Semiconductor Controlled Thyristor), BJT (Bipolar Junction Transistor), MOSFET (Metal-Oxide Semiconductor Field-Effect Transistor), and IGBT (Isolated-Gate Bipolar Transistor).

The converter device 10 also comprises a casing 15, that is, a metal shell, which encloses inside it the capacitor bank 11, the heat sink 14 and the power semiconductors 13.

The casing 15 is provided with input 15*a* and output 15*b* connectors respectively connectable to an upstream circuit, for example an electric power supply grid, and to a downstream circuit, for example connected to a load L or user device 21 to be powered.

According to some embodiments, the casing 15, during use, can be connected to an earth connection G for safety reasons.

The earth connection, depending on requirements, can be the real safety earth or a functional earth. By functional earth we mean an earth that guarantees the functioning of the electronic devices and that is sized as a function of the devices to be protected, but that does not guarantee the safety of operators according to regulations.

According to one aspect of the present invention, at least one of either the heat sink 14 or the capacitor bank 11 has a floating potential with respect to the casing 15 and therefore to the earth connection G connected to it.

According to further embodiments, both the heat sink 14 and also the capacitor bank 11 are "floating" with respect to the casing 15 and therefore to the earth connection G.

With the term "floating" or "floating potential" we mean that the heat sink 14 and/or the battery 11 of capacitors 12 are at least partly isolated with respect to the casing 15, that is, they are electrically isolated with respect to the casing 15 and therefore to the earth connection G connected to it, or they are connected to the casing 15 by means of high-impedance components or circuits, thus preventing or at least considerably limiting the generation of a parasitic current to earth G.

According to some embodiments, at least one of either the heat sink 14 or the bank 11 of capacitors 12 is electrically isolated with respect to the casing 15, that is, there is no circulation of direct current between them and the casing 15 (FIGS. 1*a* and 1*c*).

According to possible variants, at least one of either the heat sink 14 or the bank of capacitors 12 is connected to the casing 15 by means of a high-impedance component (FIGS. 1*b* and 1*d*).

According to some embodiments, the converter device 10 comprises at least a first high-impedance component 16 connected between the heat sink 14 and the earth connection G to which the casing 15 is connected (FIG. 1*d*).

According to some embodiments, the first high-impedance component 16 can have an impedance comprised between 500Ω and 1500Ω.

According to further embodiments, the first high-impedance component 16 can have an impedance comprised between 800Ω and 1200Ω.

According to some embodiments, the capacitors 12 are film type capacitors, provided with a containing body 17 made of metal material, for example aluminum.

According to some embodiments, the converter device 10 comprises a plurality of second high-impedance components 18 each connected between the containing body 17 of a capacitor 12 and the earth connection G to which the casing 15 is connected (FIG. 1b).

In this way, the capacitors 12 are substantially isolated with respect to the casing 15 of the converter device 10 and consequently the possible unwanted currents to earth G that are generated have a substantially negligible peak value.

According to some embodiments, the second high-impedance components 18 can each have an impedance comprised between 500Ω and 1500Ω.

According to further embodiments, the second high-impedance components 18 can each have an impedance comprised between 800Ω and 1200Ω.

According to some embodiments, both the heat sink 14 and also the capacitors 12 are connected to the casing 15 and therefore to earth G, by means of respective high-impedance components 16, 18.

According to further embodiments, the converter device 10 comprises at least one electrical filter 19 connected between an output connection of the converter device 10 connectable, during use, to the load L to be powered, and the earth connection G.

The electrical filter 19 comprises an RC filter provided with a resistive component R and a capacitive component C located in series with each other, and is configured to act as a low-pass filter, eliminating possible current oscillations due to distributed parasitic inductances and capacitances.

With reference to FIG. 2, the electric furnace 21 comprises a container 22, or shell, into which metal material M is introduced to be subsequently melted.

The electric furnace 21 is also provided with a plurality of electrodes 23, in the case shown three electrodes 23, configured to strike an electric arc through the metal material M and melt it.

According to some embodiments of the present invention, the electrodes 23 are installed on movement devices 24 configured to selectively move the electrodes 23 toward/away from the metal material M.

The movement devices 24 can be chosen from a group comprising at least one of either a mechanical actuator, an electric actuator, a pneumatic actuator, a hydraulic actuator, an articulated mechanism, a kinematic mechanism, similar and comparable members or a possible combination of the above.

In accordance with one possible solution of the present invention, in the event that there are three electrodes 23, each of them is connected to a respective power supply phase L1, L2, L3 of the power supply apparatus 20.

In accordance with some embodiments of the present invention, the power supply apparatus 20 comprises at least one transformer 25 connected to a power grid 26 for supplying a voltage and an alternating mains current, the transformer 25 being configured to transform the voltage and alternating supply current into a voltage and alternating base current.

According to one possible solution of the invention, the power grid 26 can be three-phase.

In accordance with some embodiments of the invention, the mains voltage Ur and the mains current Ir have a predefined mains frequency fr.

In accordance with possible solutions, the mains frequency fr is a value chosen between 50 Hz and 60 Hz, that is, based on the frequency of the power grid of the country where the furnace is installed.

In accordance with possible solutions of the present invention, the transformer 25 can comprise a transformer primary 27 magnetically coupled to at least one transformer secondary 28.

In accordance with one possible solution of the invention, the transformer 25 can comprise a plurality of transformer secondaries 28 magnetically coupled to the transformer primary 27. This solution allows to reduce the impact of disturbances grid side, that is, to reduce the harmonic content and the reactive power exchanged in the grid by the combination of the transformer 25 and the rectifier 29.

Preferably there are provided three phases connected to the transformer secondaries 28, but the number of phases could also be smaller or greater. According to some embodiments, the number of phases can vary between 1 and n, where n, for example, is an integer up to twenty, or even greater than twenty.

The base electrical energy supplied by the transformer 25 has a base voltage Ub, a base current Ib, and a base frequency fb, which are predefined and set by the design characteristics of the transformer 25 itself.

In particular, the base frequency fb is substantially equal to the mains frequency fr identified above.

The base voltage Ub, the base current Ib, on the other hand, are correlated respectively to the mains voltage Ur, and to the mains current Ir by the transformation ratio of the transformer 25 itself.

The transformer 25, for example of the multi-tap type, can be provided with regulating devices, not shown, provided to selectively regulate the electrical transformation ratio of the transformer 25 in relation to specific requirements.

The apparatus 20, according to the present invention, also comprises a plurality of rectifiers 29 connected to the transformer 25 and configured to transform the voltage and alternating base current into direct voltage and current.

Specifically, the rectifiers 29 allow to rectify the voltage Ub and the alternating base current Ib, into respective direct voltages and currents.

The rectifiers 29 can be chosen from a group comprising a diode bridge and a thyristor bridge.

In accordance with one possible solution, the rectifiers 29 comprise devices, for example chosen from a group comprising Diodes, SCR (Silicon Controlled Rectifier), GTO (Gate Turn-Off thyristor), IGCT (Integrated Gate-Commutated Thyristor), MCT (Metal-Oxide Semiconductor Controlled Thyristor), BJT (Bipolar Junction Transistor), MOSFET (Metal-Oxide Semiconductor Field-Effect Transistor) and IGBT (Isolated-Gate Bipolar Transistor).

In accordance with another aspect of the invention, the apparatus 20 comprises a plurality of converter devices 10 connected to the rectifiers 29 and configured to convert the direct voltage and current into a voltage and alternating current for powering the electrodes 23.

The converter devices can be converter devices 10 according to the invention, in which the capacitors 12 and/or the heat sink 14 are floating with respect to the earth connection G of the casing 15 of the respective converter device 10.

The converter devices 10 are connected to the electrodes 23 of the melting furnace 21 and to a control and command unit 31 configured to control and command the functioning of the converter devices 10 and to regulate the alternating power supply to the electrodes 23 over time.

According to some embodiments, the apparatus 20 comprises an electrical filter 30 connected between an output of the converter devices 10 and the load to be powered, in the example case the electrodes 23 of the furnace 21, and configured to act as a low-pass filter and dampen, or eliminate, possible oscillations of the earth current during the switching of the semiconductor devices 13, which are generated by the components of parasitic capacitance and inductances of the converter devices 10, or possibly of other components of the apparatus 20.

According to some embodiments, the electrical filter 30 can be an RC filter connected in correspondence with an output of the converter devices 10.

According to some embodiments, the electrical filter 30 can be used as an alternative to possible electrical filters 19 of the individual converter devices 10.

According to possible solutions, an electrical filter 30 could also be provided, used in addition to possible electrical filters 19 associated with respective converter devices 10.

According to some embodiments, the electrical filter 30 is of the three-phase type, and is inserted on the output phases L1, L2, L3 which are connected to the load, that is, to the electrodes 23.

The combination of the electrical filter 30 connected at the output of the converter devices 10 and of the high-impedance components 16, 18 inserted inside the converter devices 10 themselves, allow both to eliminate the oscillations of the current, and also to limit, if not eliminate, the peak of the current itself to earth.

This configuration therefore allows to use a large number of converter devices, even greater than 60, without the risk of malfunctioning of the control devices due to high current peaks generated by parasitic currents, thus making the electric power supply apparatus 20 efficient and reliable.

According to some embodiments, the resistive component R and/or the capacitive component C of the electrical filters 19, 30 can be sized as a function of the application of the converter device 10 and the characteristics of the load to be powered.

According to some embodiments, the resistive component R and the capacitive component C can be regulated by means of the control and command unit 31 in order to modify the respective resistance and capacitance values in such a way as to increase or reduce the intensity of current that flows through them.

According to some embodiments, the electrical filter 19, 30 can comprise dissipation means 36 configured to reduce the temperature of the components of the RC filter.

By way of example, the dissipation means 36 can comprise fans, or other means for moving the air, dissipation fins, or suchlike.

According to some embodiments, the electrical filter 19, 30 can also comprise temperature measurement means, for example sensors 37 associated with one or more of the resistive R and/or capacitive C components.

By way of example, the temperature measurement sensors 37 can comprise thermocouples associated with one or more of either the resistive component R or the capacitive component C.

According to some embodiments, the control and command unit 31 can receive from the sensors 37 the detected data and possibly command the activation/deactivation of the ventilation devices 36 as a function of the data received so as to maintain thermal conditions suitable to guarantee an effective functioning of the electrical filter 19, 30.

According to some embodiments, the control and command unit 31 also controls the converter devices 10 so as to selectively set the parameters of the voltage and alternating supply current as above.

In accordance with one aspect of the present invention, the control and command unit 31 is provided with regulation devices 32 configured to regulate the electric supply frequency fa of the voltage and alternating supply current and obtain a simultaneous variation of the reactance value of the power supply circuit of the electrodes.

Specifically, the supply voltage and current have a supply voltage Ua, and a supply current Ia, which are selectively regulated in relation to the melting powers involved.

In accordance with possible solutions of the present invention, the regulation devices 32 can comprise, by way of example only, a hysteresis modulator, or a PWM (Pulse-Width-Modulation) modulator.

These types of modulator can be used to command the semiconductor devices of the rectifiers 29 and of the converter devices 10. These modulators, suitably controlled, generate voltage or current values to be actuated to the electrodes 23. In particular, the modulator processes such voltage and current values and produces commands for driving at least the rectifiers 29 and the converters 10 so that the voltage and current values required by the control are present at the terminals for connection to the electrodes 23. The voltages and currents to be actuated are the result of operations performed by the control and command unit 31 on the basis of the quantities read by the process and on the basis of the process model.

In accordance with possible solutions, the rectifiers 29 can be connected to the converter devices 10 by means of at least one intermediate circuit 33 which works in direct current.

The intermediate circuit 33 is configured to store direct electrical energy and generate a separation between the load, in this specific case the electrodes 23, and the rectifiers 29, and therefore with the power grid 26.

In particular, the rapid power fluctuations resulting from the process are partly filtered by means of the intermediate circuit 33, reducing the impact on the power grid 26 side.

The control and command unit 31 can also be configured to regulate the supply voltage Ua and supply current Ia parameters generated by the converter devices 10 and supplied to the electrodes 23.

Some solutions of the present invention provide that the control and command unit 31 is also connected, in turn, to the movement device 24 in order to allow an adjustment of the position of the electrodes 23 in relation to the different steps of the melting process.

In particular, the electrodes 23 are moved by the movement device 24 in order to track the position of the material and therefore modify the length of the arc.

In this way, the control and command unit 31 can manage and command, in relation to the specific steps of the process, at least the following parameters: supply voltage Ua, supply current Ia, electric supply frequency fa, and position of the electrodes 23. The high possibility of controlling the different parameters allows to optimize the transfer of energy to the process and at the same time reduce the effects on the power grid 26 deriving from the rapid power variations on the furnace side.

According to possible solutions, the transformer 25, the rectifiers 29, connected to the transformer 25, and the converter devices 10 together define a power supply module 34.

In accordance with one possible embodiment of the invention, the apparatus 20 can be provided with a plurality of power supply modules 34, connected in parallel to each other, to the power grid 26 and to the furnace 21.

The combination of several power supply modules 34 allows to obtain an apparatus 20 that can be scaled in size in relation to the specific size of the electric furnace 21 to be powered.

According to embodiments, the number of power supply modules 34 can vary from 2 to m, where m is an integer which can be ten, twelve, twenty, forty, sixty, or even greater than sixty.

The power supply modules 34 can be connected each to an electrode 23, in order to supply the letter with electric energy. There could be provided more than one power supply module 34 for each electrode 23.

Therefore, according to the number of power supply modules 34, the apparatus 20 can comprise a high number of converter devices 10, up to sixty or even more.

In accordance with one possible solution, the control and command unit 31 is connected to all the power supply modules 34 in order to control at least the respective converter devices 10, so that each module supplies the same values of supply voltage Ua, supply current Ia, and electric supply frequency fa to the load. In this way, it is possible to prevent malfunctions of the entire system.

In accordance with one possible solution, the apparatus 20 can comprise an inductor 35 configured to obtain the desired overall reactance of the apparatus.

The inductor 35 can be connected downstream of the converter devices 10 and is sized so as to achieve the desired total equivalent reactance. In this way, it is possible to obtain an overall reactance that is given by the contribution of the inductor 35 and by the reactance introduced by the conductors that connect the system to the load.

According to some embodiments, the inductor 35 can be connected downstream of the low-pass electrical filter 30.

In general, the inductance is a (design) parameter that cannot be modified once the component is built.

By modifying the frequency (with respect, for example, to the 50 Hz of the grid) it is possible, with the same inductance, to change the reactance value that the component has in the circuit and therefore reach the desired total equivalent reactance value.

By regulating the frequency during the different steps of the process, with the present invention it is therefore possible to optimize the electrical parameters in each step. First of all, the entity (and therefore the cost) of the inductance can be contained, using it to the best of its ability during refining.

Through the electrical topology adopted for the converters it is also possible to preserve the power grid from disturbances due to the melting process (flicker reduction, harmonics, Power Factor, etc.), while at the same time guaranteeing the stability of the arc in all steps.

Furthermore, the possibility of modifying the supply frequency of the electrodes with respect to the mains frequency makes it easier to size the inductive components in conditions where spaces/costs are limited, it improves their use of the conductors, reducing resistance and therefore system losses.

In the case of an electric arc furnace, for example, with the same arc impedance, increasing the frequency increases the inductive reactance and decreases the equivalent power factor toward the load, which improves the stability of the arc (useful when, for example, the scrap is not yet melted, and the arc is not very protected) preventing it from extinguishing.

It is clear that modifications and/or additions of parts may be made to the converter device 10 and to the electric power supply apparatus 20 as described heretofore, without departing from the field and scope of the present invention.

It is also clear that, although the present invention has been described with reference to some specific examples, a person of skill in the art shall certainly be able to achieve many other equivalent forms of converter device 10 and electric power supply apparatus 20, having the characteristics as set forth in the claims and hence all coming within the field of protection defined thereby.

In the following claims, the sole purpose of the references in brackets is to facilitate reading: they must not be considered as restrictive factors with regard to the field of protection claimed in the specific claims.

The invention claimed is:

1. An apparatus to supply electric power to a high-power ohmic-inductive load corresponding to an electric furnace, comprising:

a plurality of power supply modules connected in parallel to each other, connected to a power grid, and to the load;

a transformer connected to the power grid that supplies an alternating mains voltage and an alternating mains current, the transformer being configured to transform the alternating mains voltage and the alternating mains current into an alternating base voltage and an alternating base current;

a plurality of rectifiers connected to the transformer and configured to transform the alternating base voltage and alternating base current into direct voltage and electric current, and further comprising:

a plurality of converter devices connected on one side to the rectifiers, and connected on another side to the load, and configured to convert direct voltage and current into a voltage and an alternating supply current, to be supplied to the load;

a control and command unit configured to control and command the functioning of the converter devices and regulate the voltage and the supply current over time; and wherein the control and command unit includes regulation devices configured to regulate said electrical supply frequency of said supply voltage and supply current in a manner independent of a mains frequency of said power grid and in that each converter device comprises a bank of capacitors connectable during use to a direct current power supply circuit, a plurality of semiconductors connected to the bank of capacitors and configured to be selectively turned on and off in order to allow the generation of a sinusoidal current wave toward an output, a heat sink on which said power semiconductors are installed and which is configured to dissipate the heat generated by them, and a metal casing which encloses at least the bank of capacitors, the heat sink, and the power semiconductors, wherein both the heat sink and the capacitors are floating with respect to the casing and to an earth connection of the casing.

2. The electric power supply apparatus as in claim 1, wherein said heat sink and/or said capacitors are electrically isolated with respect to said casing.

3. The electric power supply apparatus as in claim 1, comprising at least a first high-impedance component connected between said heat sink and said casing.

4. The electric power supply apparatus as in claim 3, wherein said capacitors are film-type capacitors and comprise a containing body of metal material, and said converter device comprises a plurality of second high-impedance components each connected between the containing body of a respective capacitor and the earth connection connected to said casing.

5. The electric power supply apparatus as in claim 1, wherein said at least one first component and/or said second high-impedance components have an impedance comprised between 500Ω and 1500Ω.

6. The electric power supply apparatus as in claim 1, wherein said at least one first component and/or said second components have an impedance comprised between 800 and 1200Ω.

7. The electric power supply apparatus of converter device as in claim 1, comprising at least one low-pass electrical filter, connected between an output connector suitable to be connected, during use, to the load to be powered, and the earth.

8. The electric power supply apparatus as in claim 1, comprising a low-pass electrical filter connected between an output of the converter devices and the earth, and configured to attenuate, or eliminate, possible current fluctuations directed toward the earth.

9. The electric power supply apparatus as in claim 8 wherein said electrical filter is an RC filter of the three-phase type, and is inserted on the output phases which are connected, during use, to the load.

10. The electric power supply apparatus as in claim 1, wherein said electrical filter is an RC filter provided with a resistive component and a capacitive component and comprises dissipation means configured to dissipate the thermal energy generated by one or by both the resistive and capacitive components and reduce their temperature.

11. The electric power supply apparatus as in claim 10, wherein said electrical filter comprises temperature measurement sensors associated with one or more of the resistive and/or capacitive components and configured to measure their temperature.

12. The electric power supply apparatus as in claim 1, wherein said regulation devices comprise a hysteresis modulator, or a PWM (Pulse-Width-Modulation) modulator.

13. An electric arc furnace comprising: a container or shell into which metal material is introduced to be subsequently melted and a plurality of electrodes configured to strike an electric arc through the metal material and melt it, and further comprising the electric power apparatus as in claim 1 connected between a power grid and said electrodes.

14. Apparatus configured to supply electric power to a high-power ohmic-inductive load corresponding to an electric furnace, said apparatus comprising a plurality of power supply modules connected in parallel to each other, and further configured to be connected to a power grid and to the load, each comprising:

a transformer connected to the power grid that supplies an alternating mains voltage and an alternating mains current, the transformer being configured to transform the alternating mains voltage and the alternating mains current into an alternating base voltage and an alternating base current;

a plurality of rectifiers connected to the transformer and configured to transform the alternating base voltage and alternating base current into direct voltage and electric current;

plurality of converter devices, connected on one side to the rectifiers, and on the other side configured to be connected to the load, and configured to convert direct voltage and current into a voltage and an alternating supply current, to be supplied to the load;

control and command unit configured to control and command the functioning of the converter devices and regulate the voltage and the supply current over time, wherein said control and command unit is provided with regulation devices configured to regulate said electric supply frequency of said supply voltage and supply current, in a manner independent of a mains frequency of said power grid, and obtain a regulation of the reactance of said power supply apparatus and in that each converter device comprises a bank of capacitors, connectable, during use, to a direct current power supply circuit, a plurality of power semiconductors connected to the bank of capacitors and configured to be selectively turned on and off in order to allow the generation of a sinusoidal current wave toward an output, a heat sink on which said power semiconductors are installed and which is configured to dissipate the heat generated by them, and a metal casing which encloses inside it at least the bank of capacitors, the heat sink and the power semiconductors, wherein both the heat sink and the capacitors are floating with respect to the casing and to an earth connection of said casing, wherein said converter device comprises at least a first high-impedance component connected between said heat sink and said casing, and wherein said capacitors are film-type capacitors and comprise a containing body of metal material, and said converter device comprises a plurality of second high-impedance components each connected between the containing body of a respective capacitor and the earth connection connected to said casing, wherein said at least one first component and said second high-impedance components have an impedance comprised between 500Ω and 1500Ω, and wherein said apparatus comprises a low-pass electrical filter connected between an output of the converter devices and the earth, said electrical filter being an RC filter of the three-phase type inserted on the output phases which are configured to be connected to the load, the low-pass electrical filter comprising a resistive component R having a respective resistance value and a capacitive component C having a respective capacitance value, wherein the control and command unit is configured to modify the resistance and the capacitance values in such a way as to increase or reduce the intensity of a current that flows through the resistive component R and the capacitive component C, and wherein the combination of the electrical filter connected at the output of the converter devices and of the high-impedance components inserted inside the converter devices themselves, is configured to both eliminate the oscillations of the current, and also to limit or even to eliminate the peak of the current itself to earth.

* * * * *